United States Patent
Gentile

(10) Patent No.: US 7,034,624 B1
(45) Date of Patent: Apr. 25, 2006

(54) DIGITALLY-REALIZED SIGNAL GENERATORS AND METHODS

(75) Inventor: Ken Gentile, Bahama, NC (US)

(73) Assignee: Analog Devices, Inc., Norwood, MA (US)

( * ) Notice: Subject to any disclaimer, the term of this patent is extended or adjusted under 35 U.S.C. 154(b) by 139 days.

(21) Appl. No.: 10/734,391

(22) Filed: Dec. 11, 2003

(51) Int. Cl.
*H03L 7/00* (2006.01)

(52) U.S. Cl. ........................................ 331/34; 327/105

(58) Field of Classification Search ............ 331/16–17, 331/34, 1 R; 327/105–106
See application file for complete search history.

(56) References Cited

U.S. PATENT DOCUMENTS

| | | | | |
|---|---|---|---|---|
| 4,267,601 A | * | 5/1981 | Umeda et al. ............ | 455/165.1 |
| 4,272,729 A | * | 6/1981 | Riley, Jr. .................... | 331/1 A |
| 5,898,325 A | * | 4/1999 | Crook et al. ................ | 327/105 |
| 5,983,081 A | * | 11/1999 | Lehtinen ..................... | 455/76 |
| 6,198,353 B1 | | 3/2001 | Janesch et al. .............. | 331/16 |
| 6,326,851 B1 | * | 12/2001 | Staszewski et al. .......... | 331/17 |
| 6,404,247 B1 | | 6/2002 | Wang .......................... | 327/158 |
| 6,414,555 B1 | * | 7/2002 | Staszewski et al. ........... | 331/18 |
| 6,429,901 B1 | | 8/2002 | Kiyose et al. .............. | 348/500 |
| 6,433,644 B1 | * | 8/2002 | Andrews ...................... | 331/10 |
| 6,473,478 B1 | | 10/2002 | Wallberg et al. ............ | 375/376 |
| 6,542,039 B1 | | 4/2003 | Ogura .......................... | 331/11 |
| 6,593,815 B1 | | 7/2003 | Takahashi .................... | 331/1 A |
| 6,791,422 B1 | * | 9/2004 | Staszewski et al. ......... | 331/36 C |
| 6,825,714 B1 | * | 11/2004 | Greene et al. .............. | 329/304 |

* cited by examiner

*Primary Examiner*—Timothy P. Callahan
*Assistant Examiner*—Cassandra Cox
(74) *Attorney, Agent, or Firm*—Koppel, Patrick & Heybl

(57) ABSTRACT

Signal generators are realized with combinations of a digital synthesizer (e.g., direct digital synthesizer), a frequency controller and a phase controller. The frequency controller receives a user-provided minimum count of a reference frequency wherein the minimum count is chosen to initially position a synthesizer signal within a selected frequency error of the reference frequency. In response, the frequency controller runs counters over a time sufficient to obtain the minimum count. The frequency controller then uses a difference count between the counts of the reference frequency and the synthesizer frequency to determine a controlled tuning word that properly positions the synthesizer signal. Subsequently, the phase controller detects phase differences between the reference signal and the synthesizer signal and applies phase correction signals to control the phase of the synthesizer signal.

28 Claims, 5 Drawing Sheets

DIGITALLY-REALIZED SIGNAL GENERATORS AND METHODS

BACKGROUND OF THE INVENTION

1. Field of the Invention

The present invention relates generally to signal generators and more particularly to phase-locked signal generators.

2. Description of the Related Art

Phase-locked signal generators (often termed phase-locked loops) find broad use in the building blocks (e.g., receivers, transmitters, frequency multipliers, timers and clock recovery structures) of a variety of modern electronic systems (e.g., communications systems, data processing systems and video systems). In a significant number of these uses, the signal generators must be realized with integrated circuit fabrication techniques that are specifically directed to arrays of digital gates. Accordingly, it is often found that some of the conventional generator elements (e.g., loop filters and voltage-controlled oscillators) are excessively expensive to realize and that the resulting performance is sometimes less than desired.

BRIEF SUMMARY OF THE INVENTION

The present invention is directed to signal generators which replace components of conventional phase-locked loops with elements that are generally simpler and less expensive to realize.

The novel features of the invention are set forth with particularity in the appended claims. The invention will be best understood from the following description when read in conjunction with the accompanying drawings

DETAILED DESCRIPTION OF THE INVENTION

Figure 1:
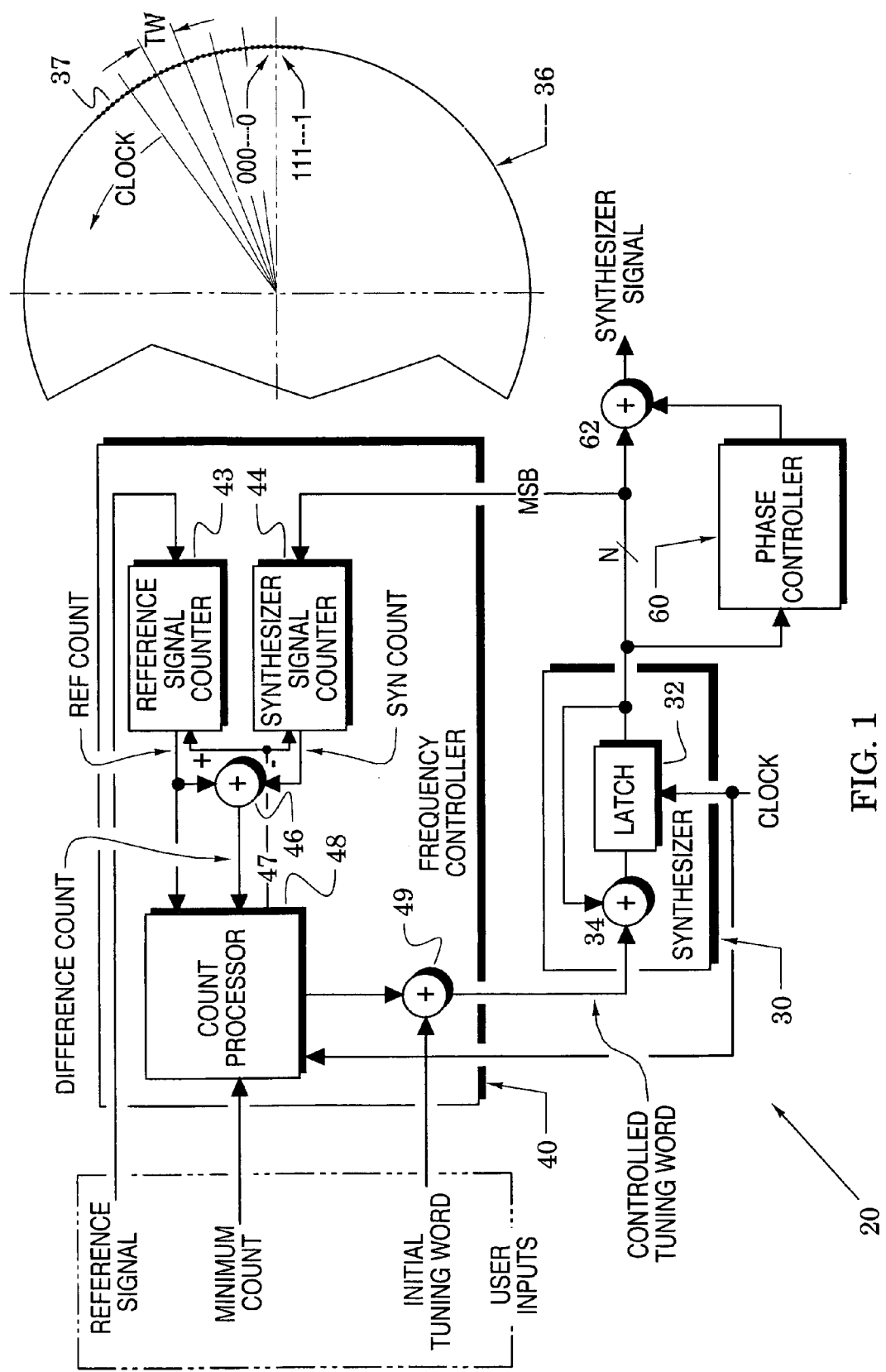
FIG. 1 is a block diagram of a signal generator embodiment of the present invention.

The block diagram of FIG. 1 illustrates a signal generator embodiment 20 which generates a synthesizer signal. The signal generator 20 includes a synthesizer 30, a frequency controller 40 and a phase controller 60. The frequency controller 40 receives the output of the synthesizer 30 and user-provided inputs (e.g., a minimum count) and provides a controlled tuning word. In response to the tuning word and to a system clock, the synthesizer 30 provides the synthesizer signal. The phase controller 60 provides phase difference signals that reduce the phase difference between the synthesizer signal and a user-provided reference signal.

In particular, the synthesizer 30 generates a synthesizer signal with a synthesizer frequency that corresponds to a tuning word and a clock signal. One embodiment of such a synthesizer is shown in FIG. 1 as a direct digital synthesizer which has a latch 32 and an adder 34 wherein the adder receives the controlled tuning word and the output of the N-bit latch and provides a sum signal to the input of the latch.

The frequency controller 40 includes a reference signal counter 43, a synthesizer signal counter 44, a differencer 46 and a count processor 48. The differencer 46 receives a synthesizer count (shown as syn count) from the synthesizer signal counter and a reference count (shown as ref count) from the reference signal counter and, in response, provides a difference count to the count processor 48. The count processor also receives the reference count from the reference signal counter.

The phase controller 60 receives the output of the synthesizer 30 and provides a phase difference signal to an adder 62 that alters the synthesizer signal.

Now that elements of the synthesizer, frequency controller and phase controller have been introduced, a subsequent operational description of the signal generator 20 is enhanced by preceding it with the following investigation of the synthesizer 30.

The output of the synthesizer's latch 32 is successively added in the adder 34 to a tuning word (TW) that is provided to the adder. FIG. 1 includes a phase wheel 36 (broken away to avoid the frequency controller) which indicates $2^N$ words 37 and pictorially illustrates how the synthesizer successively steps along the words 37 with a step size TW and at a clock rate $f_{clk}$. Accordingly, the synthesizer frequency $f_{syn}$ is given by $$f_{syn} = f_{clk} \frac{TW}{2^N} \quad (1)$$

so that it is directly proportional to the tuning word.

In operation of the signal generator 20, a user provides the reference signal and a minimum count which specifies the desired maximum frequency error of the synthesizer signal. The graph 70 of FIG. 2 indicates the frequency of the reference signal and a first range 72 of which all points are within a 10% frequency error from the reference signal. If the reference frequency is 1 MHz, for example, the first range 72 would extend 100 KHz from each side of the reference frequency. Second and third error ranges 74 and 76 are also indicated. In accordance with the example, these ranges would respectively extend 50 KHz and 25 KHz from each side of the reference frequency.

Figure 2:
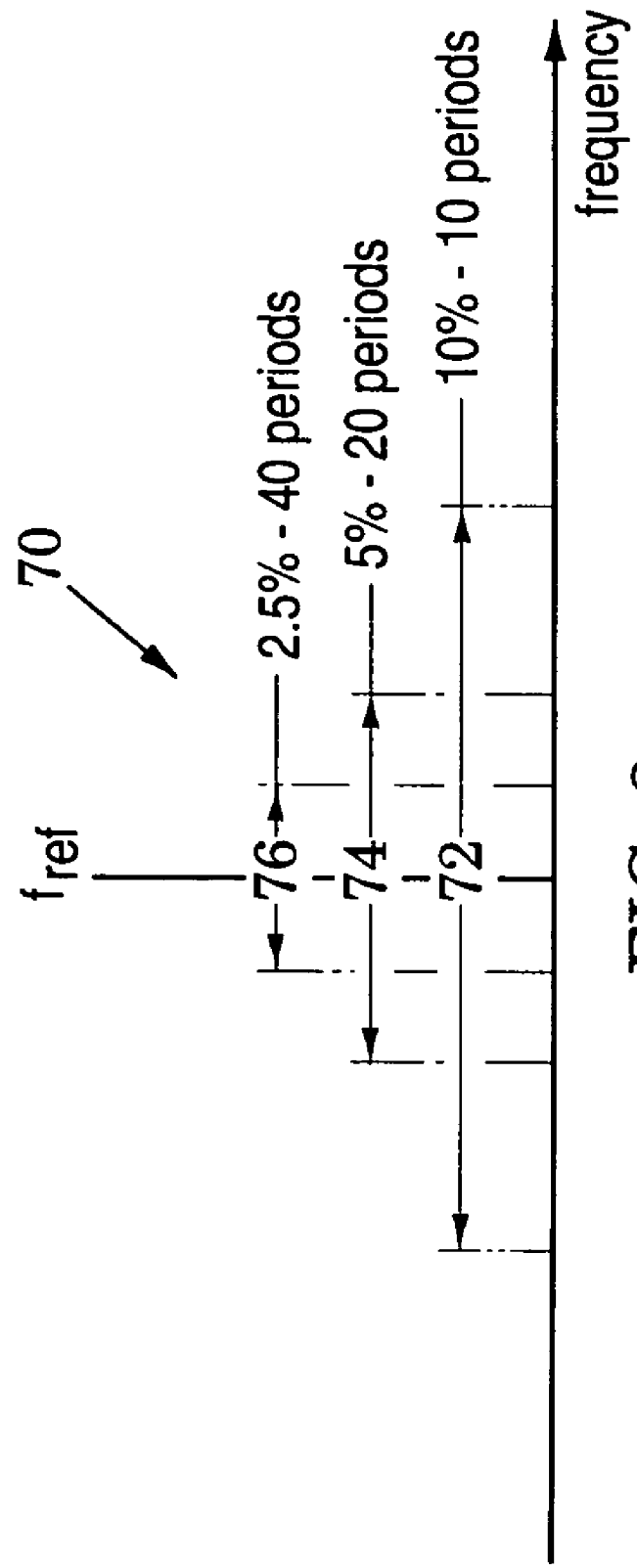
FIG. 2 is a graph that illustrates signal periods which must be measured in the signal generator of FIG. 1 to realize selected frequency errors.

An initial frequency error of 10% indicates that the generator's user wishes the initial synthesizer frequency to have an accuracy of at least 90%. To measure to an accuracy of 90%, the frequency controller 40 must measure to a frequency resolution of 10% or ¹⁄₁₀ of a frequency target. Inversely expressed in terms of signal periods, the frequency controller must measure 10 target periods of the reference signal. Accordingly, FIG. 2 shows that 10 periods must be measured to achieve a 10% frequency error. Less error requires that greater number of periods must be measured. For example, FIG. 2 shows that 20 periods must be measured to achieve a 5% frequency error and 40 periods must be measured to achieve a 2.5% frequency error. A frequency error of 1% would require the measurement of 100 periods.

A user of the signal generator 20 thus provides a selected minimum count of the reference signal to the frequency controller to specify that an initial synthesizer frequency be within a selected frequency error of the reference frequency.

In response, the count processor 48 terminates (via connection 47) the counting process of the reference and synthesizer counters 43 and 44 when the reference count has reached the minimum count.

The count processor 48 preferably utilizes the clock signal to provide a precise measure of a time period T that is sufficient to realize the minimum count. Because clock signals are generally highly accurate, a count of clock periods provides a precise time period which can be used in conjunction with the reference count and the synthesizer count of the counters 43 and 44 to determine an accurate reference frequency and a synthesizer frequency error.

If the time period T is terminated after M clock periods wherein $M=2^X$, then the counters 43 and 44 count over a time period T which is given by $$T = 2^X T_O \qquad (2)$$

in which $T_O$ is the clock period. Because the measured reference and synthesizer frequencies are respectively the reference and synthesizer counts divided by the time period T, the frequency error between them is $$f_{err} = f_{ref} - f_{syn}$$
$$f_{err} = \frac{differencecount}{T}$$
$$f_{err} = \frac{differencecount}{2^X T_O}$$
$$f_{err} = 2^{-X} f_{clk}(differencecount).$$

Since the purpose of the frequency controller 40 is to adjust the synthesizer frequency by the frequency error, $f_{err}$ may be substituted for $f_{syn}$ in equation (1) which is then rearranged to yield a tuning word adjustment of $$\Delta TW = 2^{N-X} \Delta CNT \qquad (3)$$

in which $\Delta CNT$ is the difference count provided to the count processor 48 and N and X are known to the count processor. The tuning word adjustment is summed in an adder 49 with an initial tuning word $TW_O$ to provide a controlled tuning word of $$TW = \Delta TW + TW_O. \qquad (4)$$

After the counters 43 and 44 generate the difference count, the count processor 48 thus derives the controlled tuning word of equation (4) and provides it to the synthesizer 30 which generates the synthesizer signal with a synthesizer frequency that is within the selected frequency error of the reference frequency (based on the minimum count input).

The count processor 48 may include a timer (e.g., the timer 94 in FIG. 3) that is configured to terminate after reaching a power-of-2 count. This processor embodiment is particularly suited to terminate the time period T in $2^X$ clock periods as shown above in equation (2). In other counter embodiments (e.g., one based on a programmable modulus), other termination expressions may be more suitable. It is also noted at this point that, in one generator embodiment, the reference signal of FIG. 1 may be configured as a square wave and only the most significant bit (MSB) of the synthesizer signal provided to the synthesizer counter 44.

If it is assumed that the initial tuning word is zero, equation (1) shows that the initial synthesizer frequency is zero, i.e., the synthesizer 30 does not initially generate a synthesizer signal. When the count processor provides the controlled tuning word, the synthesizer frequency then jumps to a frequency that is within the selected frequency error from the reference frequency.

Alternatively, a user may want the signal generator 20 to generate an initial synthesizer signal with an initial synthesizer frequency. To realize this goal, the user provides a corresponding tuning word so that the synthesizer 30 initially generates the desired initial synthesizer signal. The count processor 48 will subsequently alter this to realize a controlled tuning word that causes the synthesizer 30 to generate a synthesizer signal with a frequency that is within the selected frequency error from the reference frequency.

In another synthesizer embodiment, the count processor 48 can be configured to successively increase the minimum count of the reference frequency to thereby successively decrease the frequency error from the reference frequency, i.e., to successively urge the synthesizer frequency closer to the reference frequency.

Figure 3:
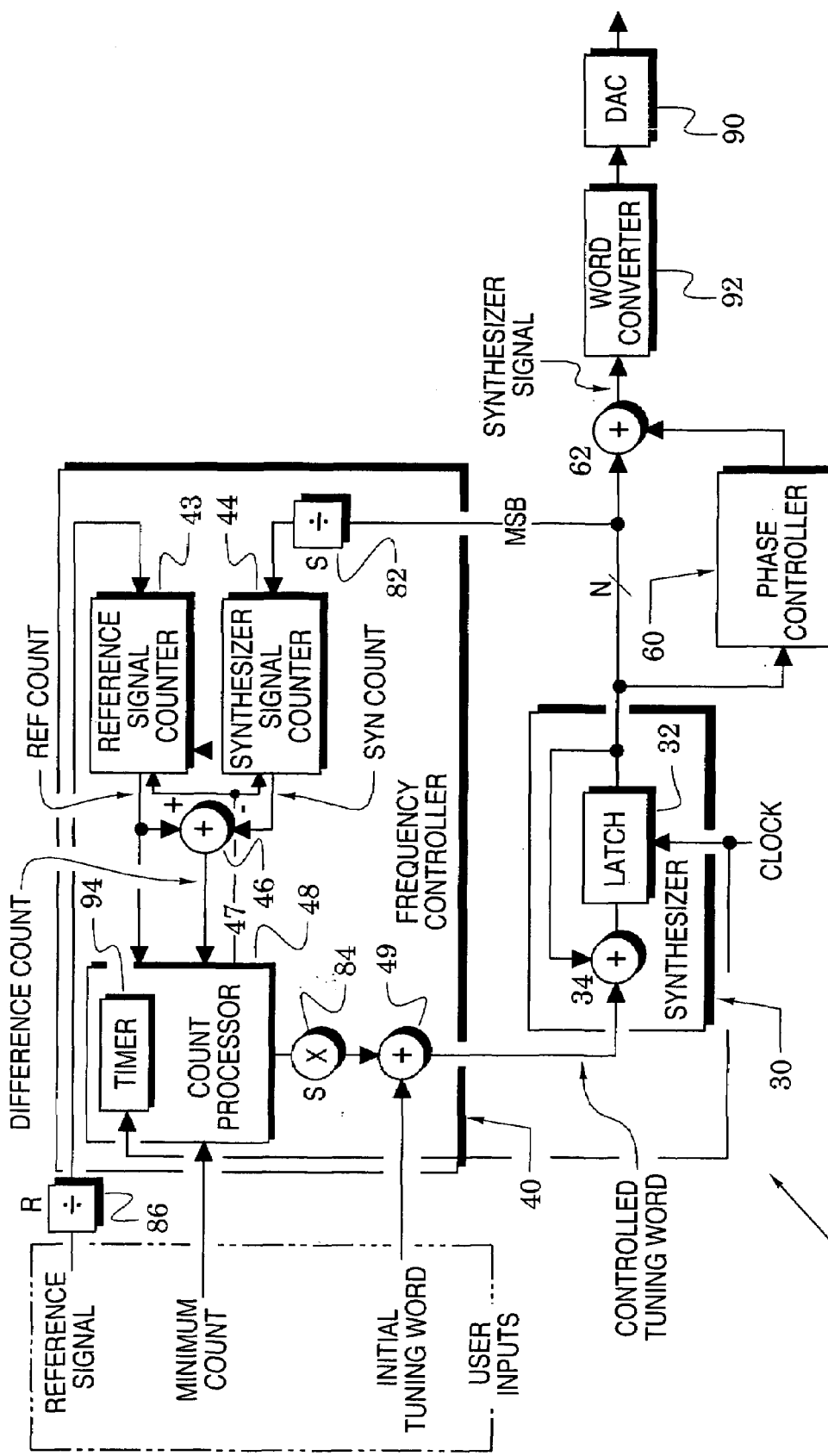
FIG. 3 is a block diagram of another signal generator embodiment.

FIG. 3 illustrates another signal generator 80 which includes elements of the signal generator 20 with like elements indicated by like reference numbers. The signal generator 80, however, inserts a frequency divider 82 before the synthesizer signal counter 44 and inserts a frequency multiplier 84 between the count processor 48 and the adder 49.

The frequency divider 82 divides by a divisor S and the multiplier multiplies by a corresponding multiplier S so that the controlled tuning word presented to the synthesizer 30 becomes $$TW = S(\Delta TW) + TW_O. \qquad (5)$$

The divider 82 effectively positions the synthesizer frequency above the reference frequency by the selected factor of S and the tuning word adjustment $\Delta TW$ is increased by the same factor because the difference count is determined from a signal that was realized by dividing the synthesizer signal by the selected factor.

The signal generator 80 also inserts a frequency divider 86 before the reference signal counter 43. This divider divides by a factor R and essentially prescales the reference signal by its factor R. Together, the frequency dividers 82 and 86 scale the synthesizer frequency by a ratio S/R and substantially enhance the range of signal frequencies that the signal generator 80 can provide.

The signal generator 80 further inserts a digital-to-analog converter 90 after the adder 62 to alter the synthesizer signal by converting it into an analog synthesizer signal. It is apparent from the phase wheel 36 of FIG. 1 that the words generated by the synthesizer 30 correspond to a triangle wave so that the digital-to-analog converter 90 will generate an analog signal with a triangular shape.

To facilitate the selection of other analog signal shapes, the signal generator 80 also provides a word converter 92 that alters words in the synthesizer signal to thereby realize selected shapes (e.g., a sinusoidal shape). The word converter may be realized with a memory configured to alter words in the synthesizer signal with predetermined substitutes (e.g., the memory is configured as a lookup table).

In the signal generator 80, the count processor 48 includes a timer 94 which receives the generator's clock signal (provided to the synthesizer 30 in FIGS. 1 and 3). The count processor 48 can be configured, for example, to stop the counters after the timer 94 has reached a predetermined number of clock periods. Because the reference frequency is unknown, this initial process may not provide a sufficient reference count to establish the desired frequency error (as exemplified, for example, in FIG. 2). This process can, however, be successively repeated with greater clock periods until a sufficient reference count is realized.

Figure 4:
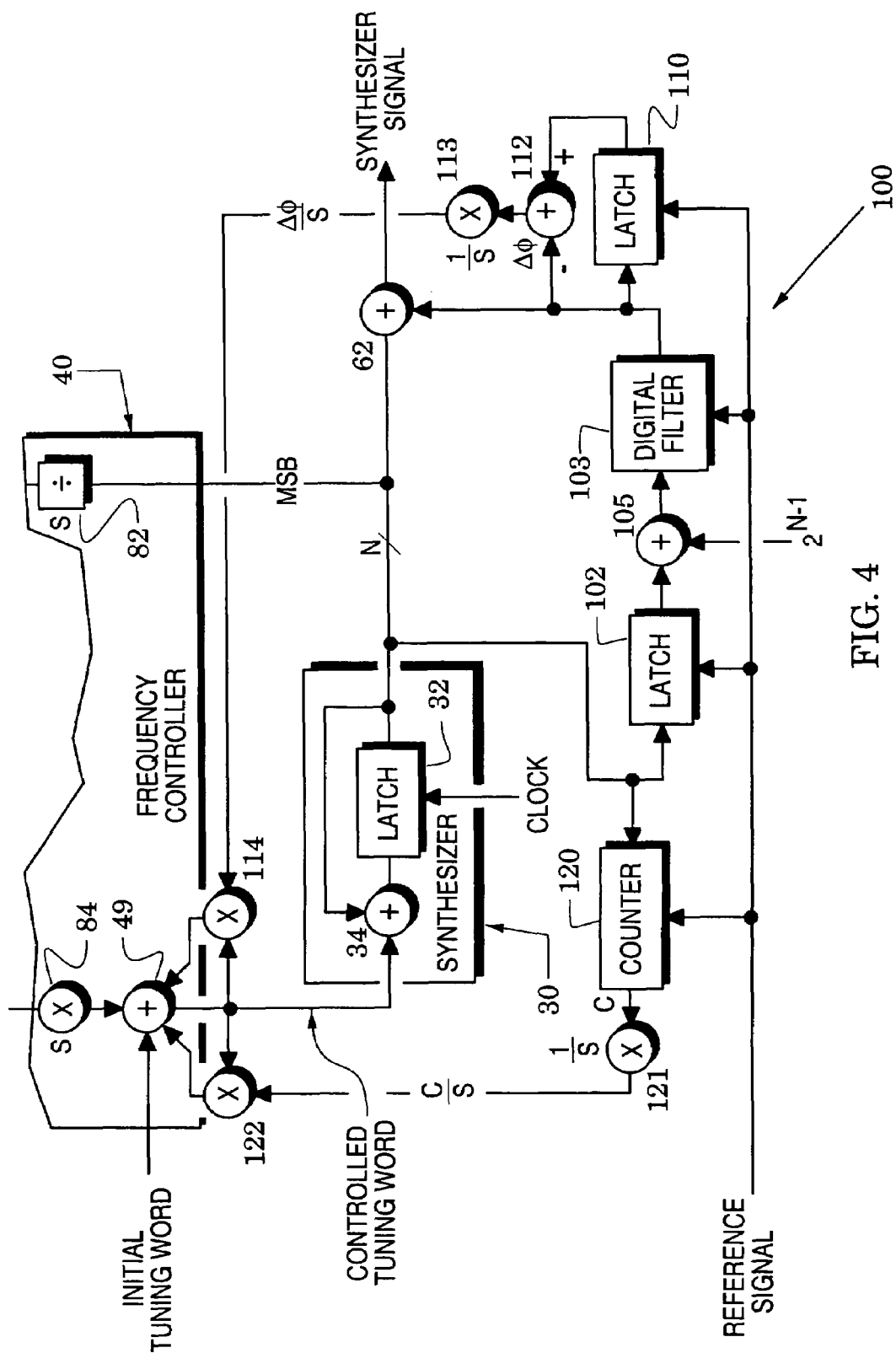
FIGS. 4 and 5 are block diagrams of embodiments of the phase controller of FIGS. 1 and 3.

Attention is now directed to FIG. 4 which shows an embodiment 100 of the phase controller 60 of FIGS. 1 and 3. The embodiment includes the synthesizer 30 and portions of the frequency controller 40 of FIG. 3 with like elements indicated by like reference numbers. In addition, this phase controller includes a latch 102 and a digital filter 103. The latch is triggered by the reference signal to thereby capture a corresponding phase difference of the synthesizer signal that is generated by the synthesizer 30.

This phase difference signal is integrated through the digital filter 103 to obtain a phase correction signal that is coupled to the adder 62 to alter the phase of the synthesizer signal. The filter 103 is structured with a lowpass transfer function and may be realized in various digital configurations (e.g., as two parallel bi-quad infinite impulse function (IIR) filters) which are arranged to minimize latency that would otherwise introduce instability. The operational point of the phase controller can be altered by inserting an offset phase (e.g., $2^{N-1}$ as shown in FIG. 4) into an adder 105 which is inserted between the latch 102 and the digital filter 103.

The phase controller 100 also includes a latch 110, a differencer 112 and digital multipliers 113 and 114. The latch receives the output of the digital filter 103 and is triggered by the reference signal. The outputs of the latch 110 and the digital filter 103 are differenced in the differencer 112 to provide the difference $\Delta\phi$ between successive phase error values. This phase difference $\Delta\phi$ is then passed through the multiplier 113 to the multiplier 114. The phase difference $\Delta\phi$ is a measure of remaining error in the synthesizer frequency and, accordingly, it is applied to the multiplier 114 to thereby further refine the controlled tuning word and further reduce the remaining frequency error.

As previously described, the divider 82 is inserted into the frequency controller 40 to position the synthesizer frequency above the reference frequency by a selected factor of S. When this is the case, the phase difference $\Delta\phi$ of the differencer 112 must be divided by the factor S before application to the multiplier 114. This is the function of the multiplier 113 which then provides the modifier $\Delta\phi/S$ to the multiplier 114.

To insure that the synthesizer 30 is generating a synthesizer frequency that is above the reference frequency by the selected factor of S, the phase controller 100 also includes a counter 120 and multipliers 121 and 122. The counter is reset by the reference signal so that it delivers a count C which is a measure of the frequency difference between the synthesizer frequency and the reference frequency.

This count is divided by the selected factor S in the multiplier 121 and applied to deliver a C/S correction factor to the multiplier 122. If the synthesizer frequency is in accordance with the selected factor of S, the correction factor will be unity and will not alter the controlled tuning word. Otherwise, the correction factor will modify the controlled tuning word to shift the synthesizer frequency above the reference frequency by the selected factor S.

Figure 5:
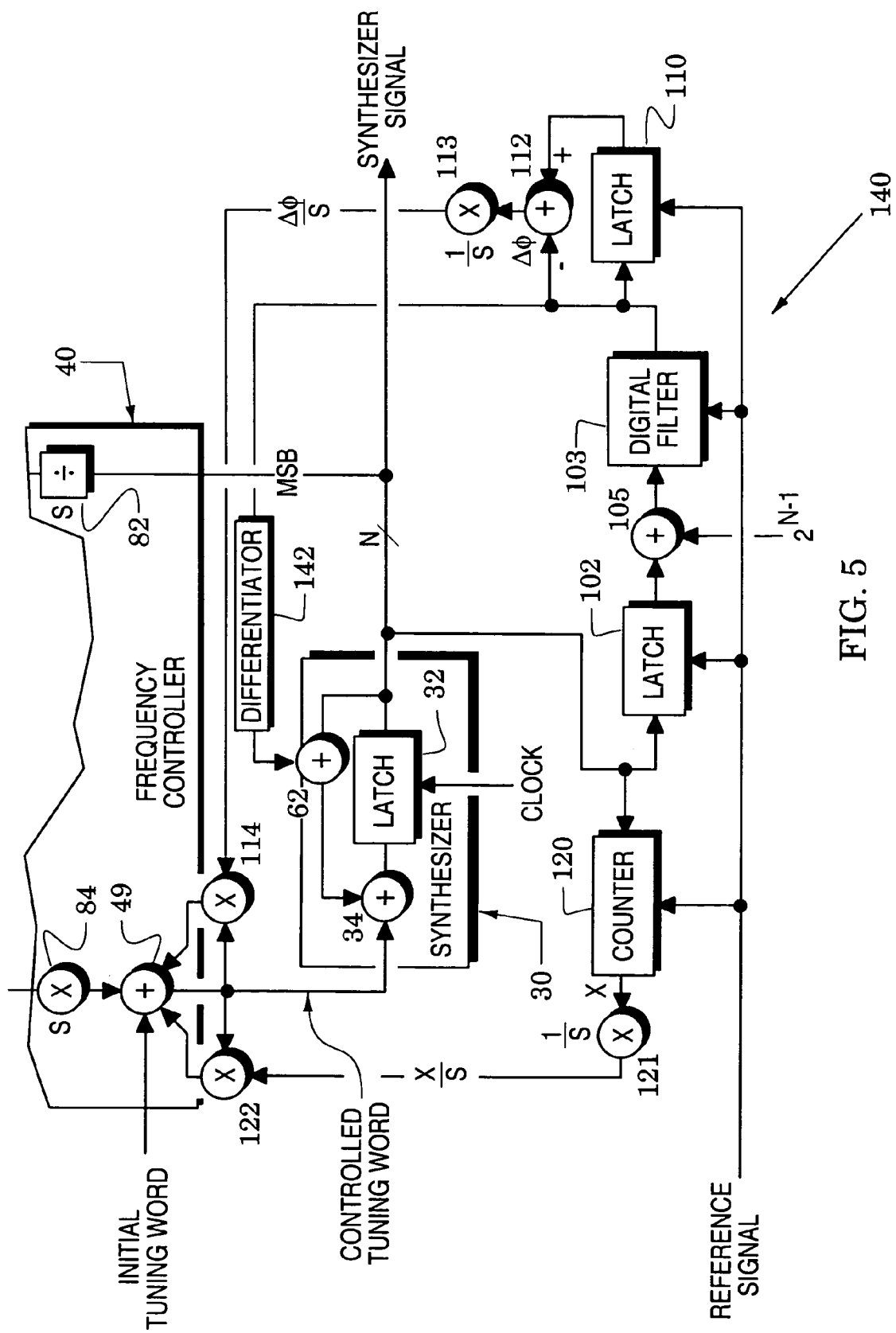

FIG. 5 illustrates another phase controller embodiment 140 which includes elements of the phase controller 100 of FIG. 4 with like elements indicated by like reference numbers. In contrast to the embodiment 100, the phase controller 140 inserts the adder 62 between the latch 32 and the adder 34 of the synthesizer 30 and precedes the adder 62 with a differentiator 142. In this phase controller embodiment, phase difference signals from the digital filter 103 are differentiated to realize their rate of change. This rate of change is then inserted into the adder 62 to momentarily alter the phase of the synthesizer 30 without altering the controlled tuning word. Accordingly, the synthesizer's phase is shifted to maintain a fixed phase relationship between the reference signal and the synthesizer signal. As mentioned above, this relationship can be shifted with offset signals into the adder 105.

The count processor 48 of FIGS. 1 and 3 can be realized with arrays of gates, with a suitably-programmed digital processor or with combinations thereof. It is noted that the count processor can realize the controlled tuning word of equation (5) by various methods. For example, the tuning word adjustment $\Delta TW$ can be realized by performing N-X shift operations on the difference count $\Delta CNT$. A digital multiplier and a digital adder can then be used to produce the controlled tuning word. Preferably, twos-complement arithmetic is used to accommodate positive and negative values of the difference count $\Delta CNT$.

Signal generators have been provided which replace components of conventional phase-locked loops (e.g., filters and voltage-controlled oscillators) with elements (e.g., direct digital synthesizers) that are simpler and less expensive to realize with integrated circuit fabrication techniques that are often encountered in modern systems (e.g., systems realized primarily with digital gates).

Because elements of these signal generators are timed with a system clock, the frequency of the synthesizer signal is generally limited to one half of the clock frequency. Although the spectral purity of the generated synthesizer signal will be degraded by phase noise and spurious content of the clock, the clock source is a fixed-frequency oscillator in which desirable performance parameters (e.g., high stability and low noise) are significantly easier and less expensive to realize than in more complex sources (e.g., voltage-controlled oscillators).

The embodiments of the invention described herein are exemplary and numerous modifications, variations and rearrangements can be readily envisioned to achieve substantially equivalent results, all of which are intended to be embraced within the spirit and scope of the invention as defined in the appended claims.

I claim:

1. A signal generator, comprising:
    a synthesizer that generates a synthesizer signal which has a synthesizer frequency that corresponds to a tuning word and a clock signal;
    a frequency controller that provides a controlled tuning word whose corresponding synthesizer frequency is within a selected frequency error from the reference frequency of a reference signal; and
    a phase controller that alters the phase of said synthesizer signal to reduce a phase difference between said synthesizer signal and said reference signal;
    wherein said frequency controller includes:
    synthesizer and reference counters that respectively provide a synthesizer count of said synthesizer signal and a reference count of said reference frequency;
    a differencer that obtains a difference count between said synthesizer count and said reference count; and
    a count processor that processes said difference count into said controlled tuning word.

2. The generator of claim 1, wherein said count processor is configured to stop said counters when said reference count reaches a predetermined minimum count.

3. The generator of claim 1, wherein said frequency controller includes an adder that alters said controlled tuning word in response to a predetermined initial tuning word.

4. The generator of claim 1, wherein said frequency controller includes:
   a frequency divider with a divisor S that couples said synthesizer signal to said synthesizer counter; and
   a frequency multiplier that multiplies said controlled tuning word by a multiplier S.

5. The generator of claim 1, wherein said phase controller includes:
   a latch that provides a phase difference signal in response to said synthesizer signal and said reference signal; and
   a digital filter that integrates said phase difference signal into a phase correction signal;
   and the signal generator further including an adder that alters said synthesizer signal in response to said phase correction signal.

6. The generator of claim 5, wherein said phase controller further includes an adder that offsets said phase difference signal in response to a selected phase offset signal.

7. The generator of claim 5, wherein said phase controller further includes:
   a counter that provides a count between said synthesizer frequency and said reference frequency;
   a multiplier that generates a correction factor in response to said count and a selected factor; and
   another multiplier that alters said controlled tuning word with said correction factor.

8. The generator of claim 5, wherein said phase controller further includes:
   another latch that receives said phase correction signal and is triggered by said reference signal to generate an output signal;
   a differencer that provides a phase difference between said phase correction signal and said output signal; and
   a multiplier that alters said controlled tuning word with said phase difference.

9. The generator of claim 1, wherein said synthesizer is an accumulator.

10. The generator of claim 1, further including a word converter inserted between said synthesizer and said digital-to-analog converter wherein said word converter alters at least one word of said synthesizer signal.

11. A signal generator, comprising:
   a synthesizer that generates a synthesizer signal which has a synthesizer frequency that corresponds to a tuning word and a clock signal;
   a frequency controller that provides a controlled tuning word whose corresponding synthesizer frequency is within a selected frequency error from the reference frequency of a reference signal; and
   a phase controller that alters the phase of said synthesizer signal to reduce a phase difference between said synthesizer signal and said reference signal;
   wherein said synthesizer is an accumulator that comprises:
   an adder; and
   a latch that receives an input signal from said adder and feeds an output signal back to said adder.

12. The generator of claim 11, further including a word converter that alters at least one word of said synthesizer signal.

13. The generator of claim 12, wherein said word converter includes a memory that stores at least one word of said synthesizer signal and a corresponding replacement word.

14. The generator stem of claim 11, further including a digital-to-analog converter that converts said synthesizer signal to an analog synthesizer signal.

15. A signal generator, comprising:
   a synthesizer that generates a synthesizer signal which has a synthesizer frequency that corresponds to a tuning word and a clock signal;
   synthesizer and reference counters arranged to provide a synthesizer count of said synthesizer signal and a reference count of a reference signal that has a reference frequency;
   a differencer that provides a difference count in response to said synthesizer count and said reference count;
   a count processor configured to:
   a) stop said difference count when said reference count reaches a predetermined minimum count; and
   b) process said difference count into a controlled tuning word whose corresponding synthesizer frequency is within a selected frequency error from the reference frequency of a reference signal; and
   a phase controller that alters the phase of said synthesizer signal to reduce a phase difference between said synthesizer signal and said reference signal.

16. The generator of claim 15, further including an adder that alters said controlled tuning word in response to a predetermined initial tuning word.

17. The generator of claim 15, wherein said frequency controller further includes a frequency divider with a divisor S that couples said synthesizer signal to said synthesizer counter and a frequency multiplier that multiplies said controlled tuning word by a multiplier S.

18. A method of locking a synthesizer signal to a reference signal, comprising the steps of:
   generating a synthesizer signal to have a synthesizer frequency that corresponds to a tuning word and a clock signal;
   providing a controlled tuning word whose corresponding synthesizer frequency is within a selected frequency error from the reference frequency of said reference signal; and
   altering the phase of said synthesizer signal to reduce a phase difference between said synthesizer signal and said reference signal;
   wherein said providing step includes the steps of:
   obtaining a difference count between said synthesizer frequency and said reference frequency; and
   processing said difference count into said controlled tuning word.

19. The method of claim 18, wherein said obtaining step includes the step of continuing a reference count of said reference frequency until it at least equals a predetermined minimum count.

20. The method of claim 18, wherein said providing step includes the steps of modifying said controlled tuning word in accordance with at least one of a predetermined frequency multiple and a predetermined tuning word.

21. The method of claim 18, wherein said altering step includes the steps of:
   sensing a phase difference signal in response to said synthesizer signal and said reference signal;
   integrating said phase difference signal into a phase correction signal; and
   altering said synthesizer signal in response to said phase correction signal.

22. The method of claim 21, further including the step of offsetting said phase difference signal in response to a selected phase offset signal.

23. The method of claim 21, further including the steps of:
   sensing a detected frequency multiple between said synthesizer frequency and said reference frequency;

forming a difference between said detected frequency multiple and a predetermined frequency multiple; and altering said controlled tuning word by said difference.

24. The method of claim 21, further including the step of altering said controlled tuning word by a correction difference between a first phase correction signal and a later phase correction signal.

25. The method of claim 24, further including the step of modifying said correction difference by a predetermined frequency multiple.

26. The method of claim 18, further including the step of substituting at least one stored word for a corresponding word of said synthesizer signal.

27. A method of locking a synthesizer signal to a reference signal, comprising the steps of:

generating a synthesizer signal to have a synthesizer frequency that corresponds to a tuning word and a clock signal;

providing a controlled tuning word whose corresponding synthesizer frequency is within a selected frequency error from the reference frequency of said reference signal; and altering the phase of said synthesizer signal to reduce a phase difference between said synthesizer signal and said reference signal;

wherein said generating step includes the step of recursively adding said tuning word at a rate of said clock signal.

28. The method of claim 27, further including the step of converting said synthesizer signal to an analog synthesizer signal.

* * * * *